United States Patent
O'Shaughnessy et al.

(10) Patent No.: US 6,899,953 B1
(45) Date of Patent: May 31, 2005

(54) SHIPPABLE HEAT-TREATABLE SPUTTER COATED ARTICLE AND ZINC CATHODE SPUTTERING TARGET CONTAINING LOW AMOUNTS OF TIN

(75) Inventors: Dennis J. O'Shaughnessy, Allison Park, PA (US); James J Finley, Pittsburgh, PA (US); Paul A. Medwick, Monroeville, PA (US)

(73) Assignee: PPG Industries Ohio, Inc., Cleveland, OH (US)

( * ) Notice: Subject to any disclaimer, the term of this patent is extended or adjusted under 35 U.S.C. 154(b) by 0 days.

(21) Appl. No.: 09/302,409

(22) Filed: Apr. 30, 1999

Related U.S. Application Data

(60) Provisional application No. 60/085,129, filed on May 12, 1998, and provisional application No. 60/084,720, filed on May 8, 1998.

(51) Int. Cl.$^7$ ............................................. B32B 17/06
(52) U.S. Cl. ....................... 428/432; 428/469; 428/336; 428/697; 428/699; 428/701; 428/702
(58) Field of Search .................. 428/212, 214, 428/334, 432, 697, 699, 469, 336, 701, 702; 359/359, 360

(56) References Cited

U.S. PATENT DOCUMENTS

| | | |
|---|---|---|
| 3,682,528 A | 8/1972 | Apfel et al. |
| 4,610,771 A | 9/1986 | Gillery |
| 4,898,790 A | 2/1990 | Finley |
| 4,902,580 A | 2/1990 | Gillery |
| 5,059,295 A | 10/1991 | Finley |
| 5,110,662 A | 5/1992 | Depauw et al. |
| 5,821,001 A | 10/1998 | Arbab et al. |

FOREIGN PATENT DOCUMENTS

| | | |
|---|---|---|
| EP | 0 698 585 | 2/1996 |
| EP | 0 751 099 | 1/1997 |
| EP | 0 803 481 | 10/1997 |
| GB | 2 311 540 | 10/1997 |
| GB | 2 315 496 | 2/1998 |
| JP | 08-171824 | 7/1996 |
| WO | 99/58736 | 11/1999 |

OTHER PUBLICATIONS

Qiu, C. X. et al., "Tin– and indium–doped zinc oxide films prepared by RF magnetron sputtering", Solar Energy Materials, Feb.–Mar. 1986, Netherlands, vol. 13, No. 2, pp. 75–84.

*Primary Examiner*—Jennifer McNeil
(74) *Attorney, Agent, or Firm*—Jacques B. Miles

(57) ABSTRACT

Tin is added to a zinc cathode target to enhance the sputter efficiency of the target. Films deposited using the cathode, e.g., greater than zero but less than 10 weight percent tin and greater than 90 but less than 100 weight percent zinc improve the chemical durability of a high transmittance, low emissivity coating stack over coating stacks having zinc oxides without tin oxide. High transmittance, low emissivity coating stacks are heated with the heated coating having reduced haze by selecting the thickness of metal primer layer between an infrared reflective film, e.g. a silver film and a dielectric film, e.g., a 52–48 zinc stannate, zinc oxide, tin oxide film or a zinc oxide film. Also disclosed are enhancing films that lower the resistivity of silver films deposited thereon and improve chemical durability of the coating stack.

18 Claims, No Drawings

SHIPPABLE HEAT-TREATABLE SPUTTER COATED ARTICLE AND ZINC CATHODE SPUTTERING TARGET CONTAINING LOW AMOUNTS OF TIN

CROSS-REFERENCE TO RELATED APPLICATIONS

This application claims priority to U.S. Provisional Application Ser. Nos. 60/084,720, and 60/085,129 filed May 8, 1998, and May 12, 1998, respectively.

FIELD OF THE INVENTION

This invention relates, in general, to a zinc cathode sputtering target having low weight percent of tin, to a shippable, heat treatable, low emissivity coating, which coating may be made using the target, to coated articles and to methods of making the coated articles.

Discussion of the Presently Available Technology

U.S. Pat. No. 4,610,771 ("U.S.P.N. '771") discloses an antireflective sputtered metal oxide film deposited using a zinc/tin alloy target. U.S.P.N. '771 in column 3, line 26, to column 4, line 12, discusses the use of the alloy target to deposit a zinc stannate film having, in general, oxides of zinc and tin preferably in proportions of 10 to 90 percent zinc and 90 to 10 percent tin.

Although the zinc/tin alloy target disclosed in U.S.P.N. '771 to deposit the zinc stannate film is acceptable, there are limitations. More particularly, in a low E coating such as the type described in U.S.P.N. '771, an infrared reflecting metal film or layer, e.g., silver is deposited on the zinc stannate film. A silver film deposited on a sputtered zinc stannate film has a higher electrical resistivity and higher emissivity than a silver film deposited on a sputtered zinc oxide film or layer. More particularly, U.S. Pat. No. 5,821,001 ("U.S.P.N. '001") discloses a silver film deposited on a zinc oxide film; the atoms of the silver film deposit in a form characterized by a low electrical resistivity which provides the silver film with a low emissivity. In depositing the zinc oxide film the process parameters are selected to deposit a zinc oxide layer with a suitable crystallinity or preferential crystal growth for favorably affecting deposition of the silver atoms of the silver film.

Sputtering zinc in a reactive atmosphere, e.g., oxygen, to provide a zinc oxide film over which a silver film having a low electrical resistivity is deposited has drawbacks. For example, it is difficult to reactively sputter a pure zinc target, i.e., a target of about 100% zinc metal, in a reactive atmosphere such as oxygen for reasons discussed in more detail below.

U.S.P.N. '001 also discloses a heat treatable low emissivity film. The thickness of the primer layers, e.g., titanium films, may be increased to provide enhanced mechanical durability, i.e., improve shear resistance. The shear resistance test consists of applying 20 successive strokes of a cloth wetted with deionized water against the coated surface of glass, followed by visual examination of the tested area. Depending on the appearance of the tested area, letter grades of D−, D, D+ ... A, A+ are assigned to the coating; then, for numerical analysis, assignments of 5 to D−, 10 to D, 55 to A, and 60 to A+ are made. If a coating shows no signs of shear, not even barely visible scratches, then it receives a maximum rating of 60. Coatings that display uniform shear and delamination at any interface of the multi-layer coating within the test area receive a failing rating of zero. Other levels of performance receive intermediate scores. This method of coating durability characterization has been found to correlate well with field performance of the coating. The drawback with using thick primer layers is that the coating stack after heating, e.g., glass tempering or glass bending operations, is likely to have a hazy appearance when viewed using a dark room, flood-light haze test. In the dark room, floodlight haze test, the coated specimen is viewed in reflection in a dark room at various viewing angles relative to a spotlight, in order to find the geometry yielding maximum scattering of light, or, in other words, haze, possible from the coating. If there is no geometry that can make haze observable, an A+ rating is assigned to the sample. Very poor samples receive D−. For purposes of numerical analysis, the letter grades are given values of 5 to 60, as described above for the shear test. Lower haze corresponds to higher numerical values.

As can be appreciated by those skilled in the art of making sputtered coatings, it would be advantageous to provide a zinc target that may be sputtered in a reactive atmosphere without the drawbacks of the presently available zinc targets and to provide low emissivity coated articles that have mechanical durability so that the coated article may be shipped and subsequently heated without the heated coating having haze.

The disclosures of U.S.P.N.'s '771 and '001 are hereby incorporated by reference.

SUMMARY OF THE INVENTION

This invention relates to a sputter cathode target having tin preferably in an amount greater than zero and less than 10 weight percent of the total weight of the target material, and zinc in an amount preferably less than 100 weight percent and more than 90 weight percent of the total weight of the target material. Hereafter, unless indicated otherwise, the term "weight percent" means the weight percent of the total weight of the target material.

As used herein, "a zinc stannate film," e.g., of the type discussed in U.S.P.N. '771 is an oxide of an alloy of zinc and tin. The cathode used is made of an alloy of zinc and tin. A "zinc oxide, tin oxide film," is a film having oxides of tin and zinc. The cathode used to sputter the zinc oxide, tin oxide film is made of zinc having additions of tin as is discussed in detail below.

In one embodiment of the invention a coating stack has a zinc stannate film deposited on a glass substrate, a zinc oxide, tin oxide film deposited on the zinc stannate film; an infrared reflecting film, e.g., silver, deposited on the zinc oxide, tin oxide film; a primer layer, e.g., a titanium metal film, deposited on the infrared reflecting film; a zinc oxide, tin oxide film deposited on the primer film, a zinc stannate film deposited on the zinc oxide, tin oxide film; an infrared reflecting film deposited on the zinc stannate film; a primer layer deposited on the infrared reflecting layer; a zinc oxide, tin oxide film deposited on the primer layer, a zinc stannate film deposited on the zinc oxide, tin oxide film; and a protective layer, e.g., a titanium metal film or a titanium oxide film, deposited over the zinc stannate film. In another embodiment of the invention, a zinc oxide film is used in place of the zinc oxide, tin oxide film. In a further embodiment of the invention, a zinc stannate film is used in place of the zinc oxide, tin oxide film. When a zinc stannate film is used in place of the zinc oxide, tin oxide film, the zinc stannate films differ in composition by at least 5 weight percent. For example, when one of the zinc stannate films is about 50 weight percent zinc and 50 weight percent tin, the other zinc stannate film is about 10–45 or 55–90 weight percent zinc and 55–90 or 45–10 weight percent tin. In a still further embodiment of the invention, a first deposited zinc stannate film is 50±10 weight percent zinc and 50±10 weight percent tin. The second deposited or overlying zinc stannate film has tin equal to or greater than 10 weight percent and less than 40 weight percent and preferably 20 weight percent, and has zinc equal to or less than 90 weight percent and greater than 60 weight percent and preferably 80 weight percent. Overlying zinc stannate films having 90 weight percent zinc and 10 weight percent tin have been used.

The above-described coating stack has mechanical and chemical durability. The coatings of the instant invention in addition to having mechanical and chemical durability which make them acceptable for shipment can be heat treated with the heat treated coating having reduced haze. The reduction in haze after heating is accomplished by selecting metal primer thicknesses which is discussed below. The procedure for determining haze was discussed above. As used herein a reduction in haze is a numerical increase of about 10. An advantage of the coatings of the instant invention is that a coating of the invention may be deposited on a substrate, the coated substrate shipped to a fabricating facility where the coated substrate is heat-treated, e.g., heated to temperatures up to about 1350° F. (732° C.). The coating of the invention has particular application in the making of solar control automotive windshields. Sheets of glass having a low emissivity coating of the invention are coated in one facility and then shipped to another facility where the coated glass sheet is processed, e.g., into an automobile windshield.

DISCUSSION OF THE INVENTION

For a full appreciation of the various embodiments of the invention, the embodiments will be discussed separately and then combined. The first embodiment of the invention to be discussed is the use of a zinc cathode having low amounts of tin to improve the deposition of zinc oxide films and the benefits of a zinc oxide film having low amounts of tin.

The embodiments of the invention relating to zinc sputtering target having low amounts of tin and to a method of reactively sputtering such zinc targets to sputter deposit a zinc oxide, tin oxide film will be discussed. As will be appreciated, the invention contemplates using the target of the instant invention to deposit a zinc oxide, tin oxide film over or under an infrared reflective film, e.g., gold, silver or aluminum film, other metal films, e.g., primer films such as a titanium metal, or ceramic films, or other dielectric films.

The sputtering cathode target in one embodiment of the invention has greater than zero weight percent and less than 10 weight percent tin, and less than 100 weight percent and more than 90 weight percent zinc to improve the emissivity of an infrared reflective film, e.g., a silver film, deposited on the zinc oxide, tin oxide film and to improve the sputtering of the zinc cathode target having low amounts of tin. The cathode target of the instant invention may also be defined as having greater than 0 and less than 10 weight percent tin with the majority of the balance zinc, or as having less than 100 weight percent and more than 90 weight percent zinc with the majority of the balance tin. Before discussing this embodiment of the invention, the drawbacks and/or limitations of reactively sputtering a zinc cathode target without tin and limitations of zinc oxide films deposited using such cathodes are discussed for a better appreciation of the invention.

Typically, a metal target is reactively sputtered in a gas such as oxygen, or gas mixture of oxygen with other gases such as nitrogen, argon or helium. Sputtering in a gas mixture will result in a higher sputtering rate for a stable process but requires more control to maintain the process stability, e.g., requires controlling flow rate of two gases. Because of the higher sputtering rate, it is preferred to sputter in a gas mixture rather than in oxygen alone. In either case the resulting coating is a metal oxide, e.g., zinc oxide when a zinc target is used.

Zinc oxide is a common dielectric material that is used as a high refractive index film in coating stacks having low emissivity. In the flat glass industry these coatings are usually applied by horizontal vacuum coaters using high power supplied from a direct current source to energize cathodes that sputter layers onto glass substrates. Higher coater throughput requires higher power density to the cathode target. This in turn increases the tendency for the targets to arc, particularly during reactive sputtering.

During reactive sputtering the frequency of arcing of the zinc cathode target increases with time, and debris in the form of powder and flakes builds up on the target surface and adjacent areas. Debris in the form of powders, flakes and splatter eventually falls onto the surface of the substrate being coated resulting in unacceptable coated product. Further the arcing increases to a point where the process becomes unstable. In addition, areas of the target surface have a tendency to blacken over time. These blackened areas are nonconductive, thus limiting the sputtering rate and leading to non-uniformity in the coating.

The arcing and debris buildup to some degree may be reduced by periodic sputter cleaning as is known by those skilled in the art of sputter coating. One technique for sputter cleaning is to periodically sputter the targets for a certain time period in an inert gas, such as argon or helium, which sputters the target as a metal. Sputter cleaning to some degree removes the oxide buildup on the target surface that causes arcing. The black areas on the target may not be reduced by sputter cleaning. The debris and arcing, however, continually degrade the target, and after a period of time, the coater downtime increases and, consequently, there is less production time for the coater. Zinc targets because of their tendency to frequently arc during sputtering are difficult to sputter clean and require longer and more frequent cleaning.

In the practice of the invention, tin is added to a zinc target to reduce if not eliminate the above drawbacks, e.g., reduce the amount of flaking debris, reduce powdery buildup on the target, minimize arcing, and minimize, if not eliminate, blackening of the target surface areas. The amount of debris and degrading of the zinc target of the instant invention is considerably less with time than for a pure zinc target. As a result, less periodic target cleaning is required with less duration of the cleaning in an inert gas.

As previously discussed, U.S.P.N. '771 discloses a zinc-tin alloy target to deposit a zinc stannate film, i.e., an oxide of a zinc tin alloy having 10 to 90 weight percent zinc and 90–10 weight percent tin. The zinc-tin alloy cathode target of U.S.P.N. '771 provides a zinc stannate film that has better chemical durability than a zinc oxide film. Further, the zinc-tin alloy cathode target has less arcing and minimal debris buildup, e.g., there is no measurable powder buildup. As is well-known in the art of sputter coating, zinc oxide films readily dissolve in acid and base solutions; zinc stannate films have reduced solubility in acid or base.

Although the properties of the zinc oxide, tin oxide film of the instant invention have not been studied in great detail, it is believed that the following will occur. As the tin approaches zero weight percent, the chemical durability of the deposited film decreases, and the problems associated with sputtering a zinc target in a reactive atmosphere increase. As the weight percent of tin approaches ten, the chemical durability of the zinc oxide film increases, and the problems associated with sputtering a zinc target in a reactive atmosphere decrease. The electrical resistivity of a silver film deposited on the zinc oxide, tin oxide film is expected to be similar to a silver film deposited on a zinc oxide film. In the practice of this embodiment of the invention, a zinc target having tin greater than zero and less than ten weight percent is a useable range; 0.5 to 9.5 weight percent of tin is a practical range; 4 to 8.5 weight percent of tin is a preferred range, and 5 to 9.5 weight percent of tin is a more preferred range. The weight percent of tin and zinc in a zinc oxide, tin oxide film is expected to be similar to the weight percent of zinc and tin in the target.

As can now be appreciated, as the weight percent of tin in the zinc cathode increases, the chemical durability of the deposited film is expected to increase. Further, the crystalline structure of the zinc oxide film having tin in weight percents greater than zero and less than ten is similar if not identical to the crystalline structure of zinc oxide film having zero weight percent of tin. Further, a zinc stannate film having 60–90 weight percent zinc and 10–40 weight percent tin have similar crystalline structures as zinc oxide. Therefore, it is expected that emissivity of silver film deposited on a zinc oxide film will be similar to a silver film deposited on a zinc stannate film having 60–90 weight percent zinc and 10–40 weight percent tin. At values of less than 60 weight percent zinc, the crystalline structure starts to change and the emissivity and resistivity start to increase. Transmission Electron Microscopy has shown a weak zinc oxide electron diffraction pattern for a zinc stannate film having 66 weight percent zinc and 34 weight percent tin, and an amorphous structure for zinc stannate film having 47 weight percent zinc and 53 weight percent tin.

The coated articles disclosed in U.S.P.N. '001 and U.S. patent application Ser. No. 09/023,746 filed Feb. 13, 1998, in the names of Mehran Arbab, Russell C. Criss, Gary J. Marietti and Paul A. Medwick for "Coated Articles" (hereinafter "U.S. patent application Ser. No. 09/023,746") may be made practicing this embodiment of the instant invention which includes but is not limited to sputtering a cathode target having 92 weight percent zinc and 8 weight percent tin in an atmosphere having more than 75% oxygen and the remainder argon. Further, problems discussed above associated with sputtering a zinc target are expected to be minimized if not eliminated.

The discussion will now be directed to improving chemical durability of the coating stack, reduction of haze of the coating stack and decreased emissivity of the infrared reflective metal, e.g., silver. "Chemical durability" means the coating is not readily attacked by acid or base solutions. Reference may be had to U.S.P.N.'s '001 and '771 for a discussion on chemical durability. The test for haze was discussed above.

From the above discussion, the emissivity of the silver film may be reduced by depositing the silver layer on a zinc oxide film; a zinc oxide, tin oxide film or a zinc stannate film having zinc in the range of 60 to 90 weight percent and tin in the range of 10 to 40 weight percent. Further, from the above discussion, chemical durability of a layer having a zinc oxide film under a silver film and over a zinc stannate film may be enhanced by adding tin to a zinc target to provide a zinc oxide, tin oxide film, or a zinc stannate film. As used herein, "a chemical and electrical enhancement film" is a zinc oxide, tin oxide film and/or a zinc stannate film having zinc in the range of 60 to 90 weight percent and tin in the range of 10 to 40 weight percent. The chemical and electrical enhancement film of the invention may be used in place of zinc oxide films to enhance chemical durability of the coating stack while obtaining a silver film having low emissivity. By way of illustration, coated articles having a glass substrate/zinc stannate film/zinc oxide film/silver film/titanium metal primer film/zinc oxide film/zinc stannate film/zinc oxide film/zinc stannate film/titanium oxide protective overcoat may be chemically enhanced by using the chemical and electrical enhancement film of the invention for one or more or all of the zinc oxide film(s) of the above coating stack.

Another coated article includes glass substrate/zinc stannate film/zinc oxide film/silver film/titanium metal primer film/zinc oxide film/zinc stannate film/titanium oxide protective overcoat. As can now be appreciated, the chemical and electrical enhancement film of the invention may be substituted for one or more or all of the zinc oxide film(s) of the above coating.

In the practice of the instant invention, a dielectric layer may include a zinc stannate film, and a chemical and electrical enhancement film. Where the chemical and electrical enhancement film is zinc stannate, the difference between the composition of the zinc stannate film and the zinc stannate film of the chemical and electrical enhancement film is at least 5 weight percent. For example, and not limiting to the invention a zinc stannate film having 58 weight percent zinc and 42 weight percent tin may be used with a zinc stannate film (chemical and electrical enhancement film) having 63 to 90 weight percent zinc and 10 to 37 weight percent tin.

The discussion will now be directed to the embodiment of the invention to provide a coating stack that is chemically and mechanically durable and a coating stack that has reduced haze after subjecting the coating stack to elevated temperatures, e.g., but not limiting to the invention, above room temperature and below about 1350° F. (732° C.). As will be appreciated by those skilled in the art, the invention is not limited to the coatings discussed below which are presented for illustration purposes only. The following Table 1 provides a few embodiments of coating stacks that may be used in the practice of the invention; however, as will be appreciated, the invention is not limited thereto.

TABLE 1

| Coating Samples | Substrate | FILM | | | | | | | | | | | |
|---|---|---|---|---|---|---|---|---|---|---|---|---|---|
| | | 1 | 2 | 3 | 4 | 5 | 6 | 7 | 8 | 9 | 10 | 11 | 12 |
| 1 | X | X | X | X | X | | X | | | | | | X |
| 2 | X | X | X | X | X | | X | | X | X | | X | X |
| 3 | X | X | | X | X | X | X | | X | X | | X | X |
| 4 | X | X | | X | X | | X | | X | X | X | X | X |
| 5 | X | X | X | X | X | X | | | X | X | | X | X |
| 6 | X | X | X | X | X | | X | | X | X | X | X | X |
| 7 | X | X | | X | X | X | X | | X | X | X | X | X |
| 8 | X | X | X | X | X | X | X | | X | X | X | X | X |
| 9 | X | X | X | X | X | X | X | X | X | X | X | X | X |
| | | A | B | | C | | D | | E | F | G | H | |
| | | Layers | | | | | | | | | | | |

The second column from the left is entitled "Substrate." The material of the substrate is not limiting to the invention and may be made of any material, e.g., glass, fiberglass, plastic, metal, wood or ceramic. The type of articles that are made in the preferred practice of the invention are transparencies for residential and commercial buildings, and land, air, space, above, on and below water vehicles, therefore, the substrate is preferably transparent and made of glass, and flexible and rigid plastics. Glass when used may be clear or tinted and the type of glass is not limiting to the invention. It is expected that the coated article will be subjected to elevated temperatures; therefore, the substrate selected should be able to withstand the elevated temperatures. In our discussion, but not limiting to the invention, the substrates are glass sheets or pieces.

The columns numbered 1–12 are films, and the columns labeled A-H are layers, of coating stacks that incorporate features of the invention. The layers (see the bottom of the Table 1) include at least one film and as shown in the Table 1 up to 3 films. The layers A, D and G are dielectric layers. The index of refraction of the dielectric films of the Layers A, D and G is preferably greater than the index of refraction of the transparent substrate to anti-reflect the infrared reflection layer. The invention is not limited to the type of dielectric films that may be used in combination with the chemical and electrical enhancement film of the invention. Dielectric films that may be used in the practice of the invention include but are not limited to zinc oxide, tin oxide, silicon oxide, silicon nitride, and silicon oxynitride. It is preferred that films 1, 6 and 11 of the layers A, D and G, respectively are each a zinc stannate film having 52 weight percent zinc and 48 weight percent tin. The films 2, 5 and 7, and 10 of the layers A, D and G respectively may be a zinc oxide film, or a chemical and electrical enhancement film of the invention. In the following discussion, the substrate is soda-lime-silicate clear glass and has an index of refraction about 1.5. As is known in the art, varying the thickness of the film and layers changes the color of the coated article, or may provide a coating with a neutral color. It is expected that in the practice of the invention, the dielectric layers and/or films have a thickness in the range of 600±500 Angstroms. The thickness of the zinc oxide film or the chemical and electrical enhancement film should be sufficient to affect the crystal structure of the silver film to be deposited thereon.

The films 3 and 8 of layers B and E, respectively, are infrared reflecting films and may be of any material that reflects infrared energy, e.g., but not limiting to gold, silver and aluminum. In the practice of the invention silver is preferred. The thickness of the silver is not limiting to the invention and is selected to provide a transparent coating having low emissivity. Silver films having a thickness of 200±150 Å and preferably 100±25 Å may be used in the practice of the invention.

The films 4 and 9 of the layers C and F, respectively, are primer films which have the function of (1) protecting the infrared metal layer from oxidizing during sputtering of the dielectric films, (2) protecting the infrared reflecting layer during high temperature processing, (3) reducing haze formation in the coating stack during heating, and/or (4) providing the coating stack with mechanical durability for shipping the coated article. Primer films may be any of the type known in the art, e.g., metals such as titanium or ceramic, of the type disclosed in U.S. patent application Ser. No. 09/215,560, filed Dec. 8, 1998, the disclosure of which is hereby incorporated by reference. In the practice of the invention, the primer layer is preferably titanium.

Film 12 of the layer H is a protective film to provide additional chemical and mechanical durability for the coating stack during shipping and storage. The invention is not limited to the type of protective film and any of the types known in the art may be used, e.g., titanium, titanium dioxide, silicon oxide, silicon dioxide, silicon aluminum nitride. Further, more than one protective film may be used. For example, but not limiting to the invention, a zinc oxide film over a titanium dioxide film may be used. The thickness of the Layer H is not limiting to the invention; however, the thickness should be thick enough to provide protection.

Before discussing in detail the Samples of the Table 1, the following background information is provided for a better appreciate of the invention.

Using zinc oxide film, as discussed above, provides a silver layer having resistivity and emissivity lower than a silver layer deposited on a zinc stannate layer having less than about 60 weight percent zinc and more than about 40 weight percent tin.

U.S.P.N. '001 discusses increasing the thickness of the primer layer to enhance the mechanical durability of the coated article to make the coated article shippable. More particularly, U.S.P.N. 001 discloses that it has been found that where the coated article will be exposed to heat treatment during its production, there is a point at which the primer layer may be made either too thin or too thick. Too thin a primer layer results in a lack of protection for the reflective, metallic film from oxidation at high temperature thus rendering the coated article unacceptable for heat treatment and in poor shear resistance which makes the article unsuitable for long distance shipment for later thermal processing. Too thick a primer layer results in the formation of an undesirable haze in the coated article after heat treatment, also rendering it unacceptable for heat treatment. However, a limitation is that these films after heating have haze.

It has been determined that by selecting dielectric films and primer layers that a coating stack can be made that has reduced haze after heating. For coated articles that are shipped but not heated, the primer layer should be thick enough to protect the silver during deposition of the overlying dielectric film or layer on the silver layer. A thickness of primer layers in the range of about 8 to 12 Angstroms is sufficient. The thickness of the primer layer is increased when the primer layer is to protect the silver during heating of the coated article. A thickness of about 20±5 Å is acceptable.

For a coated article that is shippable and heatable with reduced haze, the thickness of the primer film is adjusted to compliment the dielectric layer or film arrangement. In accordance with the teachings of the invention, primer layer thickness in the range of 18–32 Angstroms (A) and preferably 18–40 Å is acceptable to provide a coating stack with reduced haze after heating. The following Examples illustrate the invention.

In the following discussion, the thickness of the metal primer layer is as deposited. As can be appreciated, the thickness increases after heating, changing a portion of the titanium metal primer film to titanium oxide. A method that will be referred to as the "XRF Method" is discussed in U.S.P.N. '001. In general the XRF Method is used to measure the thickness of metal layers. The XRF Method uses calibrated x-ray fluorescence instrument to measure the weight of the metal per unit area of the coating (namely, in $\mu g/cm^2$). The XRF Method makes the assumption that the metal film is as dense as its bulk form. With this assumption, the metal film's measured weight per unit area is then converted to a thickness in Angstroms, using its bulk density.

For completeness sake, it should be noted that sputtered metal films are often less dense than their corresponding bulk metals, so that above described assumption is not always precisely correct, and the XRF Method may in some cases underestimate the thickness of the metal film due to this variation in density. Thus, for the thin metal films, the initial measurement of weight per unit area ($\mu g/cm^2$) is more accurate than the corresponding conversion to thickness based upon bulk density. Nonetheless, the XRF Method provides a useful approximation for comparing the relative thicknesses of the layers in coating.

In the following discussion, the thickness of the dielectric layers and/or films are given in ranges. As can be appreciated by those skilled in the art, the ranges are not limiting to the invention and the thickness may be selected to provide a coating stack of a desired color.

EXAMPLE 1

This Example 1 is Sample 1 of the Table 1. Sample 1 is a coated article that is shippable and heatable. The coating is a high transmittance, low emissivity coated article having a single infrared, reflective layer. Product having the coating stack of Sample 1 is made and the coating stack includes:

a clear glass substrate; a dielectric, antireflective layer deposited on the substrate, the layer includes (1) a zinc stannate film having 52 weight percent zinc and 48 weight percent tin (hereinafter referred to as 52–48 zinc stannate film) and having a thickness of 260±40 Å, and (2) a zinc stannate film having 90 weight percent zinc and 10 weight percent tin (hereinafter referred to as 90–10 zinc stannate film) and having a thickness of about 80±45 Å;

a silver film having a thickness of about 115±15 Å deposited on the 90–10 zinc stannate film, a titanium primer film having a thickness of 24–28 Å deposited on the metallic reflective film;

a dielectric, antireflective upper layer deposited on the titanium primer film, the dielectric, antireflective upper film includes a 52–48 zinc stannate film having a thickness of about 230±60 Å deposited on the primer layer metal oxide, and a titanium oxide layer having a thickness of 36±7 Å deposited on the 52–48 zinc stannate layer or film.

EXAMPLE 2

This Example 2 is Sample 2 of the Table 1. The coated article has been made and is shippable and heatable with reduced haze. The coated article includes a glass substrate/a layer of a 52–48 zinc stannate film having a thickness of about 230±40 Å and a zinc oxide film having a thickness of about 80±40 Å; a silver film having a thickness of 110±10 Å; a titanium metal primer film having a thickness of about 18–23 Å and preferably 19.5 Å; a 52–48 zinc stannate film having a thickness of about 820±40 Å; a silver film having a thickness of about 110±10 Å; a metal primer having a thickness of about 18–31 Å and preferably 25 Å; a 52–48 zinc stannate film having a thickness of about 200±20 Å, and a titanium film having a thickness of about 29±3 Å.

EXAMPLE 3

This Example 3 is Sample 3 of the Table 1. The coated article was not made; however, the following coated article is expected to be shippable and heatable with reduced haze. Example 3 includes a clear glass substrate; a dielectric, antireflective base layer deposited on the substrate includes a 52–48 zinc stannate film having a thickness of about 310±20 Å deposited on the glass substrate; a first silver film having a thickness of about 110±10 Å deposited on the 52–48 zinc stannate film; a first titanium primer film having a thickness of 18–29 Å deposited on the first silver film; a dielectric, antireflective intermediate layer deposited on the first primer film, the intermediate layer includes a zinc oxide film having a thickness of 80±40 Å deposited on the first primer film, a 52–48 zinc stannate film having a thickness of 740±40 Å deposited on the zinc oxide film; a second silver film having a thickness of about 110±10 Å deposited on the 52–48 zinc stannate film of the intermediate layer; a second titanium primer film having a thickness of about 18–31 Å deposited on the second silver film; a dielectric, antireflective upper layer deposited on the second primer film, the dielectric upper layer is a 52–48 zinc stannate film having a thickness of about 200±20 Å; and a titanium metal protective film having a thickness of about 29±3 Å, deposited on the 52–48 zinc stannate film of the dielectric upper layer.

EXAMPLE 4

This Example 4 is Sample 4 of the Table 1. The coated article of Example 4 was made and is shippable and heatable with the heated, coated article having reduced haze. The coated article of this Example 4 includes a clear glass substrate; a 52–48 zinc stannate film having a thickness of 310±20 Å deposited on the glass substrate; a first silver film having a thickness of 110±10 Å deposited on the 52–48 zinc stannate film; a first titanium primer having a thickness of 18–29 Å and preferably 22.5 Å deposited on the first silver film; a 52–48 zinc stannate film having a thickness of about 820±40 Å deposited on the first titanium film; a second silver film having a thickness of about 110±10 Å deposited on the 52–48 zinc stannate film; a second titanium film having a thickness of 18–32 Å and preferably 21.5 Å is deposited on the second silver layer; a zinc oxide film having a thickness of 80±40 Å deposited on the second titanium primer layer; a 52–48 zinc stannate film having a thickness of 120±40 Å deposited on the zinc oxide film and a titanium overcoat film having a thickness of 29±3 Å over the 52–48 zinc stannate film.

EXAMPLE 5

This Example 5 is Sample 5 of the Table 1. The coated article was not made; however, it is expected that the coated article is suitable for shipment and heat treatment with the heated, coated article having reduced haze. The coated article of this Example 5 includes the films and layers similar to Example 3 except Sample 5 has a 52–48 zinc stannate film having a thickness of about 230±40 Å deposited on the substrate and a zinc oxide film having a thickness of about 80±40 Å deposited on the 52–48 zinc stannate film. The first titanium primer film on the first silver layer has a thickness 15 of about 18–29 Å; the second titanium primer film on the second silver layer has a thickness of about 18–31 Å. The remaining layers of Sample 5 are as shown in the Table and have the same composition and thickness for the same films as described in Example 3.

EXAMPLE 6

This Example 6 is Sample 6 of the Table 1 and was made and is shippable and heatable with the heated, coated article having reduced haze. The coated stack is similar to the coating stack of Example 2 except a zinc oxide film having a thickness of about 80±40 Å is deposited on the second titanium primer and a 52–48 zinc stannate film having a thickness of 120±40 Å is deposited on the zinc oxide film. The first titanium primer layer had a thickness of 19–26 Å and preferably 19.5 Å, and the second primer layer had a thickness of 21.5–31 Å and preferably 25 Å. The composition and thickness of the remaining films/layers for Example 6 as shown for Sample 6 in the Table are as described in Example 2.

EXAMPLE 7

This Example 7 is Sample 7 of the Table 1 and was made and is shippable and heatable with the heated coating stack having reduced haze. The coating stack of Sample 7 is similar to the coating stack of Example 3 except a zinc oxide film having a thickness of about 80±40 Å was deposited on the second titanium film and a 52–48 zinc stannate film was deposited on the zinc oxide film. The first titanium primer layer had a thickness of about 22–26 Å and preferably 22.5 Å, and the second titanium primer layer had a thickness of about 18–25 Å and preferably 21.5 Å. The composition and thickness of the remaining films/layers for Example 7 as shown for Sample 7 on the Table are as described in Example 2.

EXAMPLE 8

This Example 8 is Sample 8 of the Table. The coated article was made and is a coated article suitable for shipment and heat treatment with the heated coated articles having reduced haze. The coated article of this Example 8 is a coated stack deposited on a clear glass substrate. The coating thickness and order of the films is as follows with film 1 deposited on the glass substrate.

TABLE 2

| Film No. from Table | Composition of the Film | Thickness of the Film |
|---|---|---|
| 1 | 52-48 zinc stannate | 230 ± 40Å |
| 2 | zinc oxide | 80 ± 40Å |
| 3 | 1$^{st}$ silver | 110 ± 30Å |
| 4 | 1$^{st}$ titanium primer | 17–26Å, preferably 19.5Å |
| 5 | zinc oxide | 80 ± 40Å |
| 6 | 52-48 zinc stannate | 740 ± 40Å |
| 8 | 2$^{nd}$ silver film | 110 ± 30Å |
| 9 | 2$^{nd}$ titanium primer | 18–31Å, preferably 28Å |
| 10 | zinc oxide | 80 ± 40Å |
| 11 | 52-48 zinc stannate | 120 ± 40Å |
| 12 | titanium metal overcoat | 29 ± 3Å |

The coated glass having the above coating was used in the fabrication of automotive windshields. The coated glass was cut to size, heated to shape the coated glass, and thereafter laminated to another shaped glass to provide an automotive windshield. The transmittance of the laminate was greater than 70%, and reflects infrared energy. The windshield was made as is known in the art. Coated glass for use in automotive windshield was also made substituting 90–10 zinc stannate for the zinc oxide film. The coated article had film thickness in the ranges recited on Table 2.

As can be appreciated, the thickness of the primer layers presented in Table 2 can vary depending on cathode and sputtering equipment. For example, a shippable and heatable coating stack with reduced haze was made with a first titanium primer film having a thickness of 18±0.5 Å and the second titanium primer film having a thickness of 22±1 Å

EXAMPLE 9

This Example 9 is Sample 9 of the Table and is a is coated article that was made. The coated article was shippable and heatable with the heated, coated article having reduced haze. The coated article of this Example 9 is a coated stack deposited on a clear glass substrate. The coating thickness and order of the films is as follows with film 1 deposited on the glass substrate.

TABLE 3

| Film No. from Table | Composition of the Film | Thickness of the Film |
|---|---|---|
| 1 | 52-48 zinc stannate | 230 ± 40Å |
| 2 | 90-10 zinc stannate | 80 ± 40Å |
| 3 | 1$^{st}$ silver | 107 ± 30Å |
| 4 | 1$^{st}$ titanium primer | 17–24A, preferably 21.5Å |
| 5 | 90-10 zinc stannate | 80 ± 40Å |
| 6 | 52-48 zinc stannate | 600 ± 100Å |
| 7 | 90-10 zinc stannate | 80 ± 30Å |
| 8 | 2$^{nd}$ silver | 127 ± 30Å |
| 9 | titanium metal primer | 20–26A, preferably 22.5Å |
| 10 | 90-10 zinc stannate | 80 ± 40Å |
| 11 | 52-48 zinc stannate | 160 ± 60Å |
| 12 | titanium oxide overcoat | 45 ± 15Å |

As can now be appreciated, a 90–10 zinc stannate film, a zinc oxide film and a zinc oxide, tin oxide film may be interchanged with one another and substituted for one another to obtain coated articles that are shippable and heatable with reduced haze. However, in the practice of the invention the 9–10 zinc stannate film is preferred.

As can be appreciated, the thickness of the films is not limiting to the invention and may be selected to provide a coated article of a desired color as is known in the art. Further, the films of all examples of the invention may be interchanged to attain the features of the invention. A complete discussion of heating the coated glass sheets to automotive windshields, residential and commercial windows and other transparencies was not given as such technology is known in the art and as can now be appreciated used in the practice of the invention.

The invention is not limited to the examples presented above and that various changes and alterations can be made without departing from the spirit and broader aspects of the invention, as defined by the claims set forth below and by the range of equivalency allowed by law.

What is claimed is:

1. A coated article comprising:
   A) a substrate;
   B) one or more dielectric layers sputter deposited over the substrate comprising:
      i) first dielectric film comprising at least one film of: zinc oxide, silicon oxide, tin oxide, silicon nitride, silicon oxynitride, or an oxide of an alloy of zinc and tin having zinc in a weight percent range of equal to or greater than 10 and equal to or less than 90 and tin in the weight percent range of equal to or less than 90 and equal to or greater than 10, and
      ii) a second dielectric film deposited over the first dielectric film, the second dielectric film comprising at least: a zinc oxide, tin oxide film, wherein the zinc oxide, tin oxide film has tin in the weight percent range of greater than 0 and less than 10 and the majority of the balance zinc, and
   C) one or more infrared reflective layers deposited on at least one of the dielectric layers.

2. The coated article of claim 1 wherein the infrared reflective layer is silver and the second dielectric film is the zinc oxide, tin oxide film as an electrical enhancing film.

3. The coated article of claim 1 wherein there is a first infrared reflective layer, and a first and a second dielectric layer, and further including:
   a metal primer layer, wherein the coated article is characterized by the first dielectric layer being over the substrate, the metal primer layer being over the first infrared reflective layer and the second dielectric layer being over the primer.

4. The coated article of claim 3 wherein the metal primer layer is a first metal primer layer further comprising:
   a second infrared reflective layer over the second dielectric layer;
   a second metal primer layer over the second infrared reflective layer; and
   a third dielectric layer over the second metal primer layer.

5. The coated article of claim 4 and further comprising:
   a protective layer as a last layer on the substrate.

6. The coated article of claim 4 wherein the third dielectric layer comprises a first dielectric film of zinc in the weight percent range of equal to or greater than 60 and equal to or less than 90 and tin in the weight percent range of equal to or greater than 10 and equal to or less than 40.

7. The coated article of claim 4 wherein the substrate is a glass sheet and the first dielectric film of the first dielectric layer is on the glass sheet and has a thickness in the range of 230±40 (Å); the second dielectric film of the first dielectric layer is on the first dielectric film of the first dielectric layer and has a thickness in the range of 80±40 Å; the first infrared reflective metal layer is a first silver film deposited on the second dielectric film of the first dielectric layer and has a thickness in the range of 110±30 Å, the first metal primer layer is a titanium containing film deposited on the first silver layer and has a thickness in the range of 17–26 Å; the first dielectric film of the second dielectric layer is deposited on the titanium containing film and has a thickness in the range of 80±40 Å; the second dielectric film of the second dielectric layer is deposited on the first dielectric film of the second dielectric layer and has a thickness in the range of 740±40 Å; the second infrared reflective metal layer is a second silver film deposited on the second dielectric film of the second dielectric layer and has a thickness in the range of 110±38 Å; the second primer metal layer is a titanium containing film deposited on the second silver layer and having a thickness in the range of 18–31 Å; the first dielectric film of the third dielectric layer is deposited on the second titanium containing film and has a thickness in the range of 80±40 Å; the second dielectric film of the third dielectric layer is deposited on the first dielectric film of the third dielectric layer and has a thickness in the range of 120±40 Å, and further comprising a protective layer of titanium containing film deposited on the third dielectric layer and has a thickness in the range of 29±3 Å.

8. The coated article of claim 3 wherein the first dielectric film of the second dielectric layer has zinc in the weight percent range of equal to or greater than 60 and equal to or less than 90 and tin in the weight percent of equal to or greater than 10 and equal to or less than 40.

9. The coated article of claim 3 wherein the second dielectric layer further includes a third dielectric film over the second dielectric film.

10. The coated article of claim 9 wherein the third dielectric film of the second dielectric layer is selected from zinc oxide film; zinc oxide, tin oxide film; and a film of an oxide of an alloy of zinc and tin.

11. The coated article of claim 1 wherein the coated article is a transparency.

12. The coated article of claim 11 wherein the coated article is an automotive transparency.

13. The coated article of claim 12 wherein the automobile transparency is an automotive windshield having a pair of glass sheets laminated together and one of the sheets is the substrate having the coating.

14. The coated article of claim 1 wherein there is one infrared reflective layer, one dielectric layer, and further comprising:
   a metal primer layer;
   a film of an oxide of an alloy of zinc and tin having 10–90 weight percent zinc and 90–10 weight percent tin over the primer layer, the coated article is characterized by the dielectric layer being over the substrate, the infrared reflective layer being over the dielectric layer, the metal primer layer being over the infrared reflective layer, and the film of an oxide being over the metal primer layer.

15. The coated article of claim 1 wherein there are first and second infrared reflective layers, first second and third dielectric layers, and further comprising:
   a first and second metal primer layers; and
   a film of an oxide of an alloy of zinc and tin having 10–90 weight percent zinc and 90–10 weight percent tin, the coated article is characterized by the first dielectric layer being over the substrate, the first infrared reflective layer being over the first dielectric layer, the first metal primer layer being over the first infrared reflective layer, the film of the oxide being over the first metal primer layer, the second dielectric layer being over the film of the oxide, the second silver layer being over the second dielectric layer, the second primer layer being over the second silver layer, and the third dielectric layer being over the second primer layer.

16. The coated article of claim 1 wherein there are first and second infrared reflective layers, first and second dielectric layers, and further comprising:
   first and second metal primer layers; and
   a film of an oxide of an alloy of zinc and tin having 10–90 weight percent zinc and 90–10 weight percent tin, the coated article is characterized by the first dielectric layer being over the substrate, the first infrared reflective layer being over the first dielectric layer, the first metal primer layer being over the first infrared reflective layer, the second dielectric layer being over the first primer layer, the second silver layer being over the second dielectric layer, the second primer layer being over the second silver layer, and the film of an oxide of an alloy of zinc and tin being over the second primer layer.

17. The coated article of claim 1 wherein there are first and second infrared reflective layers, first and second dielectric layers, and further comprising:
   first and second metal primer layers; and
   a film of an oxide of an alloy of zinc and tin having 10–90 weight percent zinc and 90–10 weight percent tin over the primer layer, the coated article is characterized by the first dielectric layer being over the substrate, the first infrared reflective layer being over the first dielectric layer, the first metal primer layer being over the first infrared reflective layer, the film of an oxide of an alloy of zinc and tin being over the first primer layer, the second silver layer being over the second dielectric layer, the second primer layer being over the second silver layer, and the second dielectric layer being over the second primer layer.

18. A method of making an automobile transparency comprising:
   applying a coating on a glass substrate having the following:
   a first dielectric layer over a glass substrate;
   a first infrared reflecting metal layer over the first dielectric film:
   a first metal primer layer over the first reflective layer;

a second dielectric layer over the first metal primer layer;

a second infrared reflective layer over the second dielectric layer;

a second metal primer layer over the second infrared reflective layer;

a protective film overlying the first zinc stannate film of the third dielectric layer, wherein at least one of the dielectric layers includes a first dielectric film selected from the group consisting of zinc oxide, tin oxide and a first zinc stannate film and a second dielectric film including a second zinc stannate film having a composition different than the first zinc stannate film and a composition of 10–90 weight percent zinc and 90–10 weight percent tin;

processing the coated substrate to provide a coated windshield blank wherein the processing step includes heating the coated substrate to its bending temperature and after heating the coating has reduced haze;

laminating the coated blank to another piece of glass to provide the automobile windshield.

* * * * *